(12) United States Patent
Rada et al.

(10) Patent No.: US 8,957,830 B2
(45) Date of Patent: Feb. 17, 2015

(54) PCB ANTENNA LAYOUT

(75) Inventors: Patrick Rada, San Jose, CA (US);
Vaneet Pathak, Los Altos, CA (US);
Gregory Poilasne, El Cajon, CA (US)

(73) Assignee: Tyco Electronics Services GmbH (CH)

( * ) Notice: Subject to any disclaimer, the term of this patent is extended or adjusted under 35 U.S.C. 154(b) by 126 days.

(21) Appl. No.: 13/643,266

(22) PCT Filed: Apr. 26, 2011

(86) PCT No.: PCT/US2011/033896
§ 371 (c)(1),
(2), (4) Date: May 2, 2013

(87) PCT Pub. No.: WO2011/137099
PCT Pub. Date: Nov. 3, 2011

(65) Prior Publication Data
US 2013/0207879 A1    Aug. 15, 2013

Related U.S. Application Data

(60) Provisional application No. 61/328,080, filed on Apr. 26, 2010.

(51) Int. Cl.
| | | |
|---|---|---|
| H01Q 21/00 | (2006.01) | |
| H01Q 1/38 | (2006.01) | |
| H01Q 21/06 | (2006.01) | |
| H01Q 21/08 | (2006.01) | |
| H05K 3/36 | (2006.01) | |
| H01P 11/00 | (2006.01) | |

(52) U.S. Cl.
CPC ............... *H01Q 21/00* (2013.01); *H01Q 1/38* (2013.01); *H01Q 21/065* (2013.01); *H01Q 21/08* (2013.01); *H05K 3/36* (2013.01); *H01P 11/00* (2013.01)
USPC ......................................... 343/893

(58) Field of Classification Search
CPC ....... H01Q 21/061; H01Q 3/26; H01Q 1/246; H01Q 1/38; H01Q 21/205
USPC .................. 343/893, 702, 700 MS, 821, 876; 716/15, 2, 124
See application file for complete search history.

(56) References Cited

U.S. PATENT DOCUMENTS

| | | | | |
|---|---|---|---|---|
| 6,295,633 | B1 * | 9/2001 | Murakawa ..................... | 716/124 |
| 6,917,848 | B1 * | 7/2005 | Nakayama et al. ........... | 700/121 |
| 2003/0167453 | A1 * | 9/2003 | Smith et al. .................... | 716/15 |
| 2005/0086616 | A1 * | 4/2005 | Wang et al. ..................... | 716/2 |

(Continued)

FOREIGN PATENT DOCUMENTS

| | | |
|---|---|---|
| CN | 101375298 A | 2/2009 |
| EP | 2063488 A1 | 5/2009 |

(Continued)

OTHER PUBLICATIONS

International Application Serial No. PCT/US2011/033896, International Search Repor mailed Jul. 11, 2011, 4 pgs.
International Application Serial No. PCT/US2011/033896, Written Opinion mailed Jul. 11, 2011, 4 pgs.

(Continued)

*Primary Examiner* — Huedung Mancuso

(57) ABSTRACT

A circuit board panel includes a plurality of circuit boards (PCB). One or more antenna boards (615) are formed in spare areas about the plurality of circuit boards (PCB). Antenna boards may also be coupled to circuitry on the circuit boards in a detachable manner.

19 Claims, 12 Drawing Sheets

(56) References Cited

U.S. PATENT DOCUMENTS

| | | | |
|---|---|---|---|
| 2006/0231198 A1* | 10/2006 | Vasoya | 156/256 |
| 2007/0096995 A1* | 5/2007 | Lee | 343/702 |
| 2008/0258993 A1* | 10/2008 | Gummalla et al. | 343/876 |
| 2010/0225554 A1* | 9/2010 | Huang et al. | 343/821 |

FOREIGN PATENT DOCUMENTS

| | | |
|---|---|---|
| KR | 100771785 B1 | 10/2007 |
| KR | 1020090014279 A | 2/2009 |
| KR | 1020100026780 A | 3/2010 |
| TW | 201208511 A | 2/2012 |
| WO | WO-2011137099 A1 | 11/2011 |

OTHER PUBLICATIONS

"Korean Application Serial No. 10-2012-7030229, Office Action mailed Jan. 24, 2014", (W/ English Translation), 5 pgs.

"Korean Application Serial No. 10-2012-7030229, Office Action mailed Oct. 11, 2013", (W/ English Translation), 5 pgs.

"Korean Application Serial No. 10-2012-7030229, Response filed Apr. 23, 2014 to Office Action mailed Jan. 24, 2014", (W/ English Translation), 22 pgs.

"Korean Application Serial No. 10-2012-7030229, Response filed Dec. 11, 2013 to Office Action mailed Oct. 11, 2013", (W/ English Translation), 25 pgs.

"Chinese Application Serial No. 201180020842.8, Office Action mailed Nov. 3, 2014", (W/English Translation), 19 pgs.

\* cited by examiner

PCB ANTENNA LAYOUT

PRIORITY CLAIMS AND RELATED APPLICATIONS

This application is a nationalization under 35 U.S.C. 371 from International Application No. PCT/US2011/033896, filed Apr. 26, 2011, entitled "PCB ANTENNA LAYOUT," which claimed benefit of priority of U.S. Provisional Application Ser. No. 61/328,080, entitled "PCB ANTENNA LAYOUT," filed on Apr. 26, 2010, the benefit of each of which is hereby respectively presently claimed, and each of which is hereby incorporated herein by reference in its respective entirety.

BACKGROUND

Printed Circuit Boards (PCBs) are used to build a variety of devices. Wireless devices commonly utilize circuitry, including one or more transceiver(s) coupled to one or more antenna(s). Many wireless devices utilize a detached dipole antenna that is coupled to a circuit board on which the circuitry is supported. Such devices utilize a cable having one RF connector to couple the cable to the dipole antenna, and another RF connector to couple the cable to the circuit board. The two RF connectors can add substantial cost to the overall manufacturing cost of a wireless device. Further expense arises from the use of a dipole antenna, a part separate from the circuit board, and likely involving a further supplier to provide the part. The use of a further supplier also adds expense and overhead in the manufacture of the wireless device.

Other wireless devices may use antennas that are formed of conductors printed on a circuit board or of conductive structure for instance a stamped metal structure forming an antenna. Such antennas are generally formed on a separate circuit board panel and then attached to the wireless device circuit board via a cable with the use of RF connectors at the antenna and circuit board. This also adds the expense, as additional parts are required. Still further circuit boards may include antennas formed on the circuit board. While reducing expense of some of the antennas, many wireless devices may utilize further detached antennas to enhance spatial diversity and improve performance. Such external antennas add to the cost of manufacturing the wireless device.

DETAILED DESCRIPTION

Figure 1:
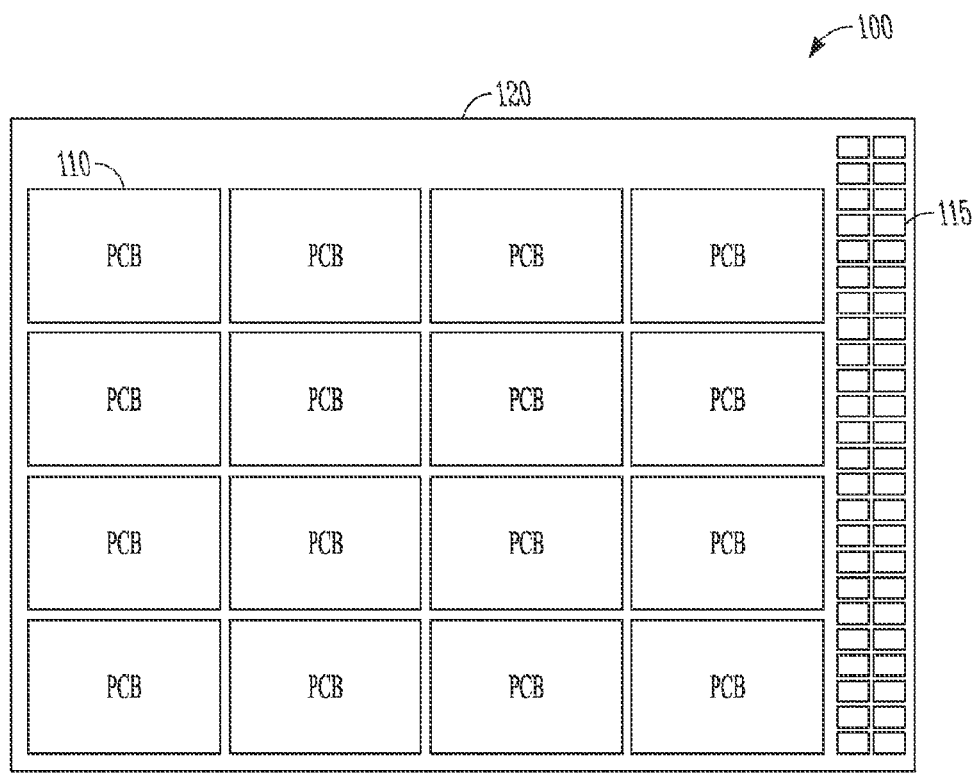
FIG. 1 is a top view representation of a circuit board panel used to form multiple circuit boards and antenna boards according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

As presented in the following discussion, methods and apparatus for PCB antenna structures are configured to use spare areas on a panel, which are not used for device components, and to lay out traces for antenna boards therein. The antenna structures may be configured of conductive materials, such as metals, and may be printed on the PCB substrate. The antenna structures are laid out in the spare areas of the panel. The antenna boards may be formed in a column or row on the panel. The column or row may be located between circuit boards. In some embodiments, the column or row may be located on an outer edge of the panel. The antenna boards may be formed in at least one column and at least one row on the panel. The circuit boards and antenna boards may be separated from the panel, wherein at least one separated antenna board is coupled to a separated circuit board. In one example, at least one separated antenna board is coupled to the separated circuit board in a vertical orientation. The vertically oriented separated antenna board may be physically coupled to the separated circuit board and soldered to connect the antenna to circuitry on the separated circuit board. The antenna may be formed to behave like a metamaterial (MTM) structured antenna.

Antenna boards and wireless device circuit boards are formed on a same panel of a substrate such as a printed circuit board (PCB or fire retardant—FR4) material in some embodiments. The antennas may be defined in spare areas of the panel after layout of the wireless device circuit boards. By forming the antennas on spare areas of the panel, the cost of the antenna may be greatly reduced from that of a dipole antenna, or antenna boards formed on separate circuit board panels. The antennas may be formed with the same process used to form the circuit boards, obviating the need for separate parts and potential separate subcontractors from the circuit board manufacturer.

In various embodiments, a circuit board may have one or more antennas formed on it with various orientations to obtain spatial diversity and increase performance. At least one antenna may be formed on a portion of the circuit board such that it may be detached and mounted with a vertical orientation to the circuit board, either on the board, or off the board with a cable connecting it to the board. If mounted vertically on the circuit board, the need for separate cables and RF connectors may be avoided. In some embodiments, the antennas may be formed to behave like Metamaterial (MTM) antennas.

Metamaterials are manmade composite materials engineered to produce desired electromagnetic propagation behavior not found in natural media. The term "metamaterial" refers to many variations of these man-made structures, including Transmission-Lines (TL) based on Composite Right and Left-Hand (CRLH) propagation. A practical implementation of a pure Left-Handed (LH) TL includes Right-Hand (RH) propagation inherited from the lump elemental electrical parameters. Such a composition includes LH and RH propagation or modes and results in unprecedented improvements in air interface integration, Over-The-Air (OTA) performance and miniaturization. while simultaneously reducing Bill Of Materials (BOM) costs and SAR values. MTMs enable physically small but electrically large air interface components, with minimal coupling among closely spaced devices. MTM antenna structures in some embodiments are copper printed directly on the dielectric substrate and can be fabricated using a conventional FR-4 substrate or a Flexible Printed Circuit (FPC) board.

A metamaterial structure may be a periodic structure with N identical unit cells cascading together where each cell is much smaller than one wavelength at the operational frequency. A metamaterial structure as used herein may be any RF structure to which is applied capacitive coupling at the feed and inductive loading to ground. In this sense, the composition of one metamaterial unit cell is described by an equivalent lumped circuit model having a series inductor (LR), a series capacitor (CL), shunt inductor (LL) and shunt capacitor (CR) where LL and CL determine the LH mode propagation properties while LR and CR determine the RH mode propagation properties. The behaviors of both LH and RH mode propagation at different frequencies can be easily addressed in a simple dispersion diagram such as described herein below with respect to FIGS. 7A and 7B. In such a dispersion curve, $\beta>0$ identifies the RH mode while $\beta<0$ identifies the LH mode. An MTM device exhibits a negative phase velocity depending on the operating frequency.

The electrical size of a conventional transmission line is related to its physical dimension, thus reducing device size usually means increasing the range of operational frequencies. Conversely, the dispersion curve of a metamaterial structure depends mainly on the value of the four CRLH parameters, $C_L$, $L_L$, $C_R$, $L_R$.

As a result, manipulating the dispersion relations of the CRLH parameters enables a small physical RF circuit having electrically large RF signals. This concept has been adopted successfully in small antenna designs as well as in other RF device designs.

In addition to the desire for ever smaller devices, there is also the recent growth in the use of Wireless Wide Area Networks (WWAN), the adoption of broadband Wireless Local Area Networks (WLAN), and increasing consumer demand for seamless global access has pushed the wireless industry to support most broadband wireless standards in different geographical areas by supporting multi-band and multi-mode operations in cellular handsets, access points, laptops, and client cards. These concurrent and sometime conflicting goals have created a great challenge for engineers in RF and antenna design to develop 1) multi-band, 2) low-profile, 3) small, 4) better performing (including Multiple Input-Multiple Output (MIMO)), 5) accelerating time to market, 6) low cost, and 7) easy to integrate in devices listed above. Conventional antenna technologies satisfy a subset of these seven criteria, however, they hardly satisfy all of them.

In building the various devices used in such wireless products, a circuit board panel may include a plurality of circuit boards. One or more antenna boards or other RF device boards are then formed in spare areas about the plurality of circuit boards. In some embodiments, antenna boards may be formed coupled to circuitry on the circuit boards in a detachable manner.

In some examples, a circuit board panel includes a plurality of circuit boards and a plurality of antenna boards formed in spare areas about the plurality of circuit boards. The circuit boards may be laid out in an array of rows and columns, and the antenna boards may be formed in rows or columns about the rows and columns of the circuit boards. The rows or columns of antenna boards may be formed between corresponding rows or columns of circuit boards. The circuit boards may be laid out in an array of rows and columns, and wherein the antenna boards are formed between four adjacent corners of the circuit boards. In some embodiments, a circuit board panel includes multiple circuit boards and multiple antenna boards, wherein at least one of which is electrically coupled to a circuit board and is at least partially routed such that it is detachable from the circuit board. The antenna board and circuit board may include pads to facilitate electrical coupling when the antenna board is detached. The antenna board may include tabs, wherein the circuit board may include corresponding slots. The tabs and slots may be arranged such that when the antenna board is detached and inserted in the circuit board, the antenna is vertically oriented with respect to the circuit board. In one embodiment, the tabs and slots are keyed such that the antenna board may only be inserted in one direction and such that contacts line to facilitate proper electrical connection. In some embodiments, the antenna may be formed to behave like a metamaterial (MTM) antenna.

FIG. 1 is a top view representation of a circuit board panel 100 used to form multiple circuit boards 110 and printed antenna boards 115 according to an example embodiment. In one embodiment, the circuit boards are arranged in a matrix having rows and columns. Such an arrangement creates empty board space or spare areas 120 that may be used to form the antenna boards 115. In FIG. 1, the spare areas are shown along the sides of the panel 100. Antenna boards 115 are show arranged in two columns as rectangles having long sides shown extending horizontally. The columns of antenna boards 115 are shown on an outer portion the panel to the side of the circuit boards 110 in one embodiment.

Panel 100 may vary in size from different manufacturers, ranging up to two feet on a side or more. The outside edges of panels may be subject to process variations, so a buffer zone on the outside edges may be defined to prevent the layout of circuitry in areas where the process may vary too much. Buffer zones are typically 1 inch or so. In one embodiment, both circuit boards 110 and antennas 115 are laid out without extending into the buffer zone.

In some circuit board processes, the circuit board may be formed of multiple layers, with traces and vias formed in the different layers. In a two layer circuit board, traces are formed on both sides of a board. In a four layer circuit board, two boards may both have traces, and be stacked and separated by a dielectric layer. A six layer circuit board may utilize three boards, and so on. The antenna traces may be formed on any of the layers, or in some embodiments on multiple layers. In some embodiments, the antennas may be formed to behave like Meta material (MTM) antennas. A distance between antenna traces may also be controlled by selecting various layers that are separated a desired distance.

A computer aided design (CAD) application or program may be used to layout the circuit boards and antenna boards. In one embodiment, the circuit boards are first laid out to optimize the amount of used area on a panel. Then, spare areas may be identified, followed by layout of the antenna boards in the spare areas. In further embodiments, once a maximum amount of boards that can be formed on a panel is identified, the boards may be rearranged to provide desired locations for inserting antenna boards in rows, columns, between intersections of four board corners, or even removing a board to allow placement of antenna boards in place of the circuit board. Once laid out and masked, layers are built and laminated, and then etched to form conductors. Via processing is performed by drilling and plating to form the vias. Finally, the boards may be routed or scored or drilled without separation. Components may then be mounted on the boards, and finally, the boards may be separated.

Figure 2:
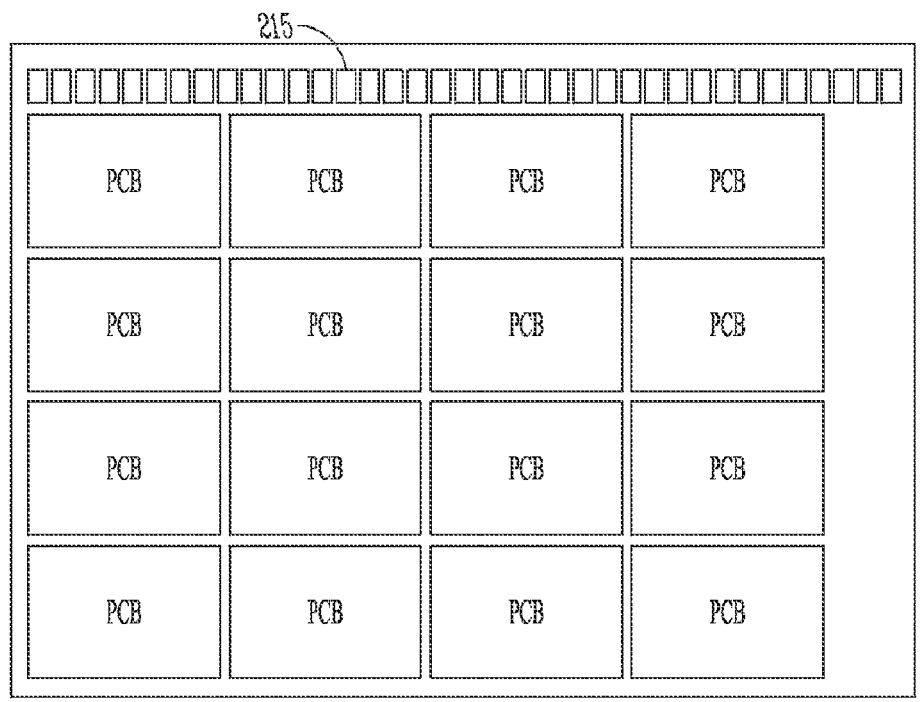
FIG. 2 is a top view representation of a circuit board panel used to form multiple circuit boards and antenna boards in a further position according to an example embodiment.

FIG. 2 is a top view representation of a circuit board panel used to form multiple circuit boards and antenna boards in a further position according to an example embodiment. In this embodiment, a row of antenna boards 215 is formed to one side of the circuit boards. The antenna boards are laid out as rectangles with long edges in a vertical direction when looking at the panel in FIG. 2.

Figure 3:
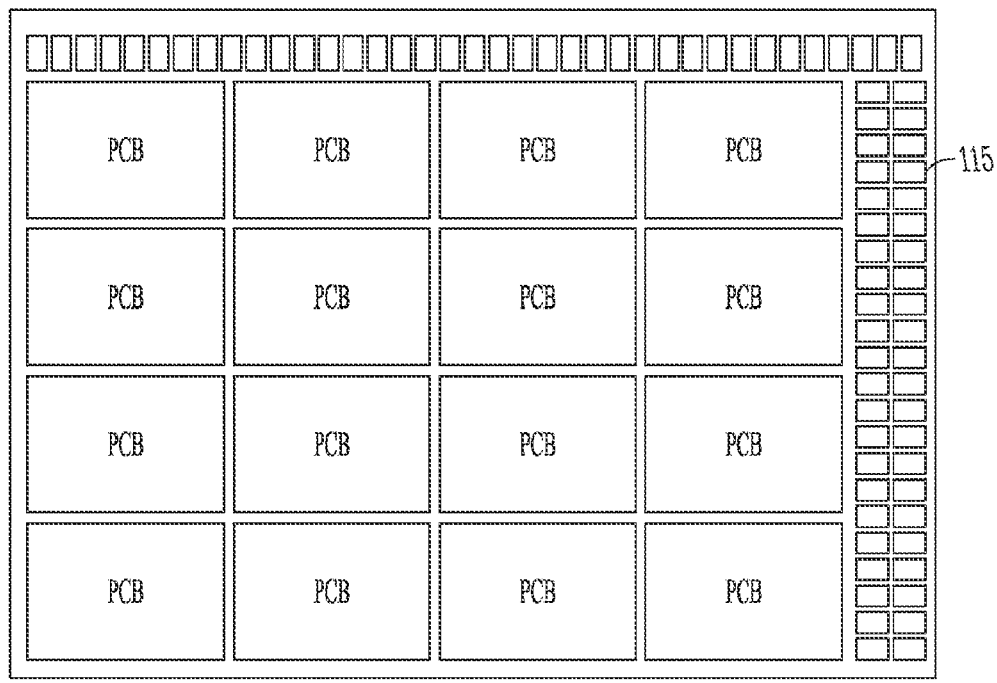
FIG. 3 is a top view representation of a circuit board panel used to form multiple circuit boards and antenna boards in a row and a column according to an example embodiment.

FIG. 3 is a top view representation of a circuit board panel used to form multiple circuit boards and antenna boards in a row and a column according to an example embodiment. FIG. 3 shows the layout of the antenna boards as combining the layouts illustrated in FIGS. 1 and 2, with both two columns 115 and one row 215 of antenna boards. Many other variations may be utilized in further embodiments, with one or more rows and columns on one or more sides of the panel.

Figure 4:
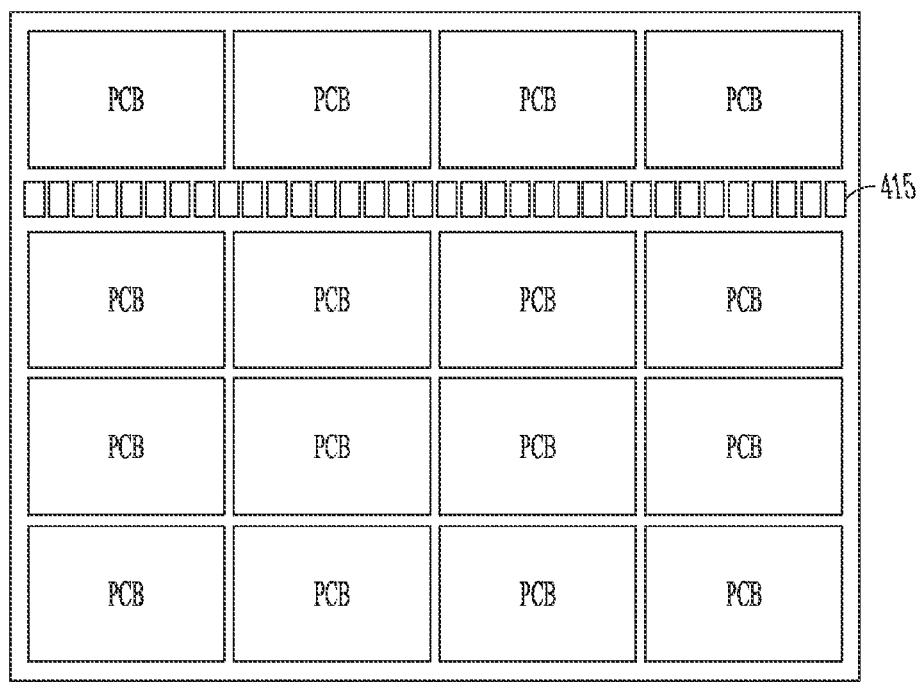
FIG. 4 is a top view representation of a circuit board panel used to form multiple circuit boards and antenna boards in an interior row according to an example embodiment.

FIG. 4 is a top view representation of a circuit board panel used to form multiple circuit boards and antenna boards in an interior row 415 according to an example embodiment. In this embodiment shown, the interior row is between two rows of circuit boards, and the antenna boards are oriented with their long side shown vertically.

Figure 5:
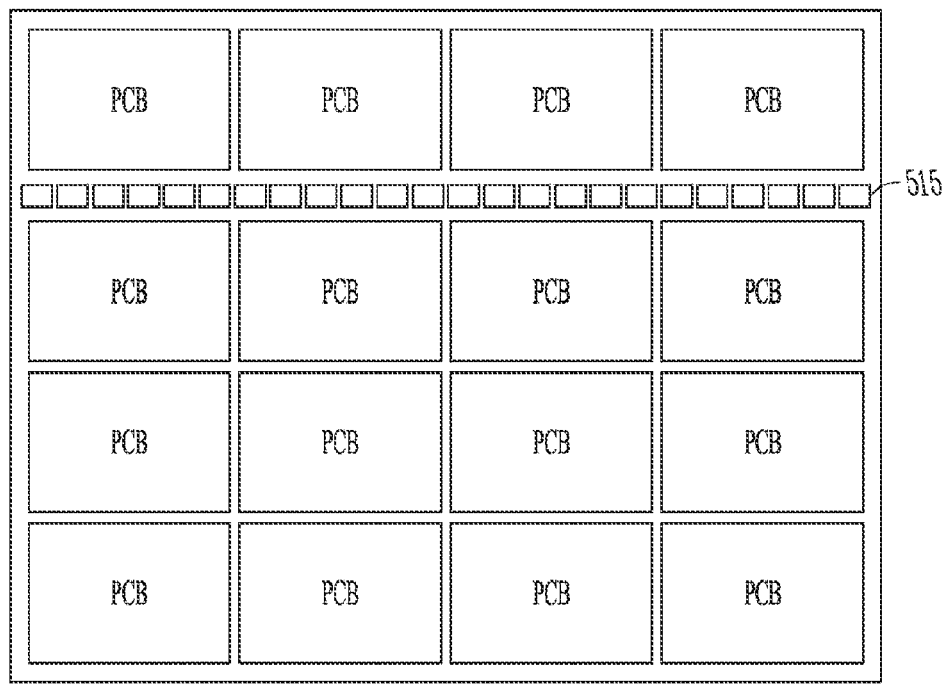
FIG. 5 is a top view representation of a circuit board panel used to form multiple circuit boards and antenna boards in an interior row with a different orientation according to an example embodiment.

FIG. 5 is a top view representation of a circuit board panel used to form multiple circuit boards and antenna boards in an interior row 515 with a different orientation according to an example embodiment. In this embodiment shown, the interior row is between two rows of circuit boards, and the antenna boards are oriented with their long side shown horizontally.

Figure 6:
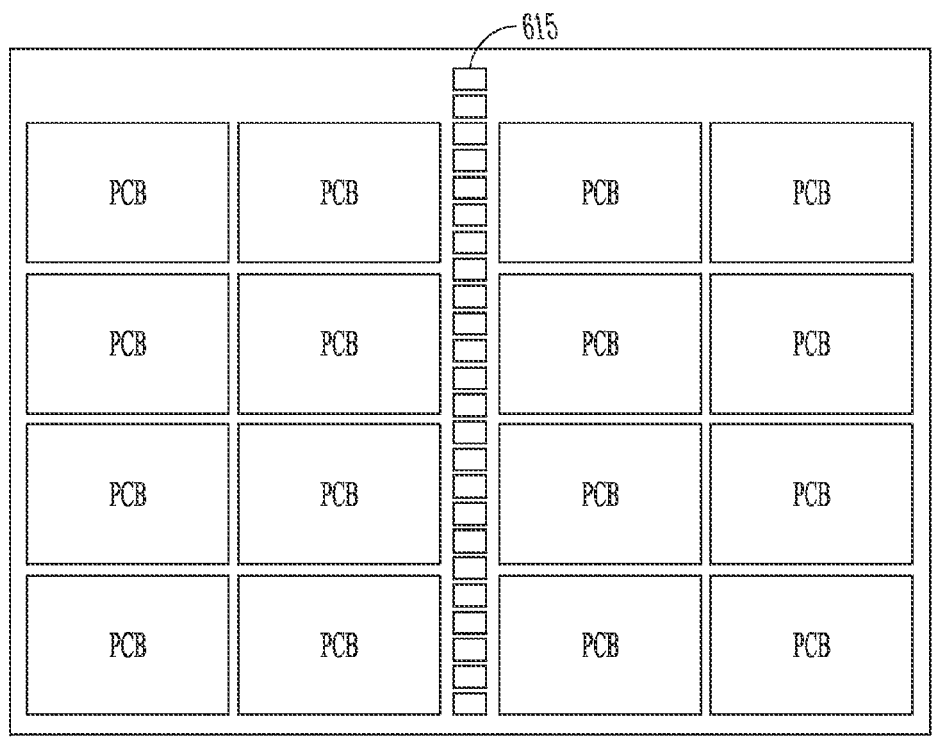
FIG. 6 is a top view representation of a circuit board panel used to form multiple circuit boards and antenna boards in an interior column according to an example embodiment.

FIG. 6 is a top view representation of a circuit board panel used to form multiple circuit boards and antenna boards in an interior column 615 according to an example embodiment. In this embodiment shown, the interior column is between two columns of circuit boards, and the antenna boards are oriented with their long side shown horizontally.

Figure 7:
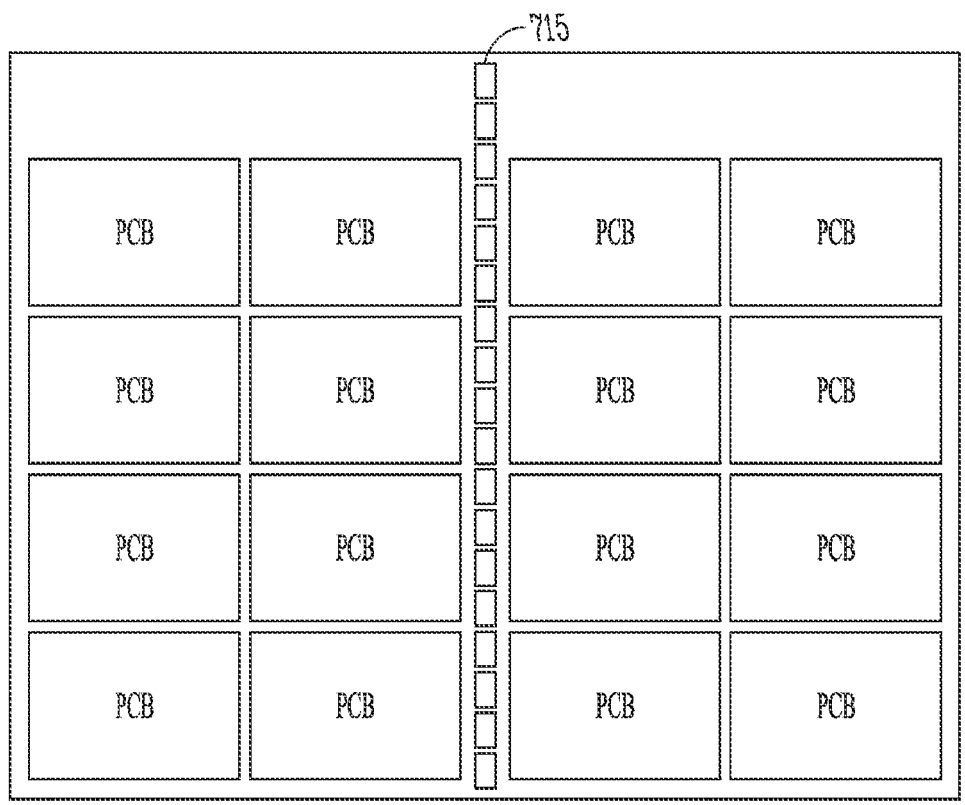
FIG. 7 is a top view representation of a circuit board panel used to form multiple circuit boards and antenna boards in an interior column with a different orientation according to an example embodiment.

FIG. 7 is a top view representation of a circuit board panel used to form multiple circuit boards and antenna boards in an interior column with a different orientation according to an example embodiment. In this embodiment shown, the interior row is between two columns of circuit boards, and the antenna boards are oriented with their long side shown horizontally. In further embodiments, multiple interior rows or columns of antenna boards may be formed between two rows or columns of circuit boards, of between multiple different rows or columns of circuit boards.

Figure 8:
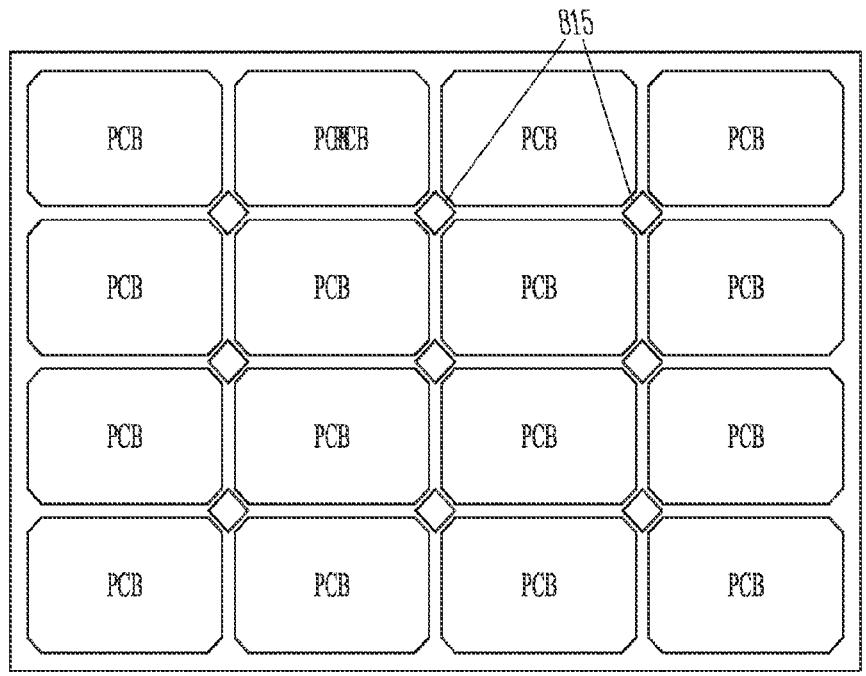
FIG. 8 is a top view representation of a circuit board panel used to form multiple circuit boards and antenna boards between corners of circuit boards according to an example embodiment.

FIG. 8 is a top view representation of a circuit board panel used to form multiple circuit boards and antenna boards 815 between corners of circuit boards according to an example embodiment. In this embodiment, the circuit boards may be formed with chamfered corners to provide additional space for layout of the antenna boards. As indicated, the antenna boards are laid out at an angle corresponding to the angles of the chamfers. The use of the chamfers allows optimization of the spacing between sides of adjacent circuit boards. Only a little space is needed at the corners of the circuit boards to form the chamfers and allow layout of the antenna boards in a manner to optimize utilization of the panel.

Figure 9:
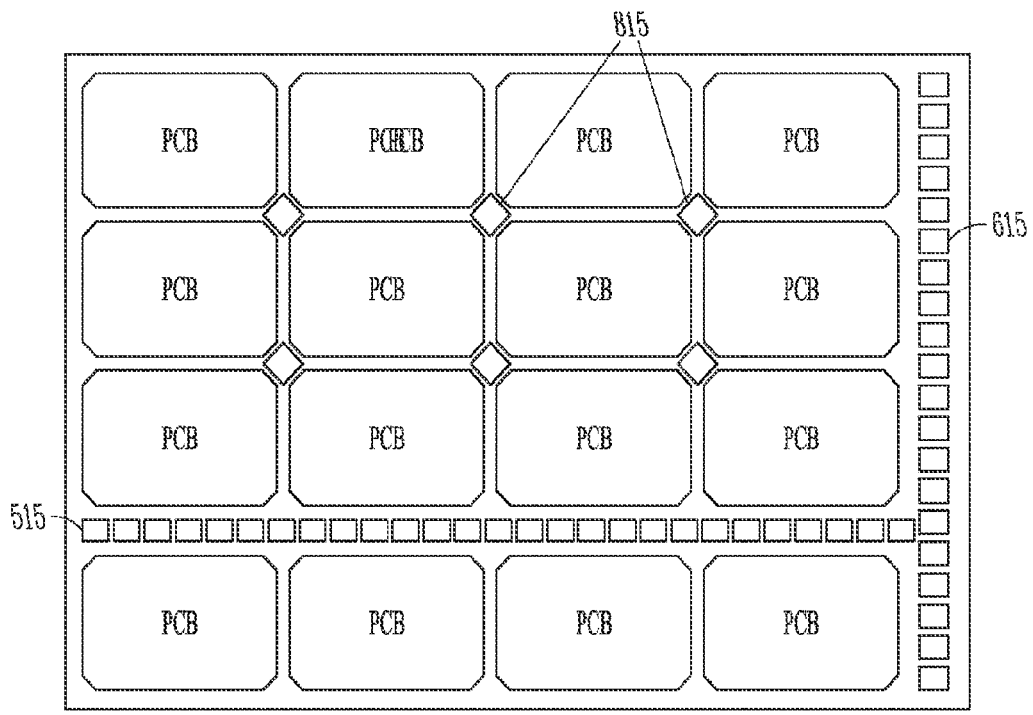
FIG. 9 is a top view representation of a circuit board panel used to form multiple circuit boards and antenna boards in multiple different orientations according to an example embodiment.

FIG. 9 is a top view representation of a circuit board panel used to form multiple circuit boards and antenna boards in multiple different orientations according to an example embodiment. This embodiment illustrates the use of rows 515, columns 615 and angled antenna boards 815 interspersed in the panel between circuit boards and on the outside edges of the panel. Many different combinations of the different layouts of antenna boards may be used to optimize panel space.

In further embodiments, the layout of antenna boards may be at least partially driven by circuit board processing constraints. In some circuit board processes, process variations may occur if larger concentrations of conductor such as copper result from the layout. The antennas generally have a low conductor surface area than the circuit boards, which may have many metalized vias, and may be used to reduce conductor concentrations by inserting antenna boards between circuit boards requiring larger areas of conductor. Addressing such constraints by modifying the locations of antenna boards may result in a tradeoff with optimizing utilization of the entire panel space, but may also result in increased yield.

Figure 10:
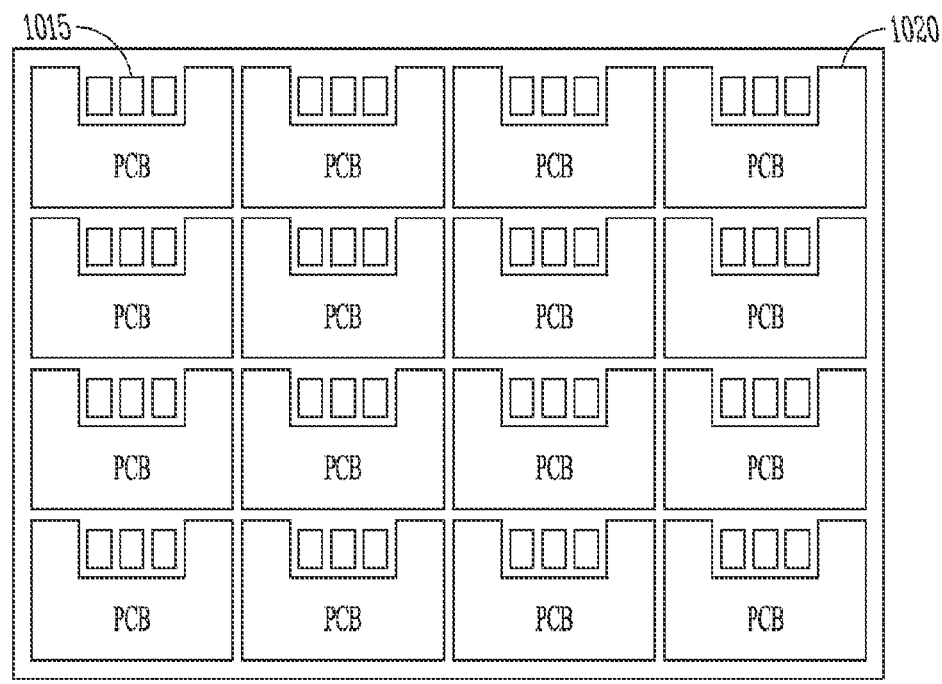
FIG. 10 is a top view representation of a circuit board panel used to form multiple circuit boards and antenna boards within a non-rectangular shaped circuit board according to an example embodiment.

FIG. 10 is a top view representation of a circuit board panel used to form multiple circuit boards and antenna boards 1015 within a non-rectangular shaped circuit board 1020 according to an example embodiment. In this embodiment, the circuit boards maybe formed in a shape other than a rectangle, such as the illustrated "U" or "C" shape. Such a shape is bounded by a rectangular perimeter for layout purposes in one embodiment, allowing the formation of antenna boards within the unused portion of the rectangular perimeter. Three such antennas are shown within the spare area associated with each circuit board in this embodiment. The antenna boards are removable from the panel in the same manner as the circuit boards, usually by routing or scoring and separating them following processing to form the conductive areas.

Some low end manufacturing processes can perform scoring only across an entire panel in a straight line. In these cases, instead of scoring, the board can have drill holes in close succession, so that the antenna board can still be separated if needed. Routing is used to separate boards where scoring is not feasible. Routing consumes more of the panel, and if used, the individual boards end up utilizing extra space on the panel to account for the material removed by routing. If scoring is available, either by virtue of using a higher end manufacturing facility able to score partial lengths, or by layouts that allow scoring across a panel, more boards may be formed on a panel because little if any material is consumed by scoring.

Figure 11:
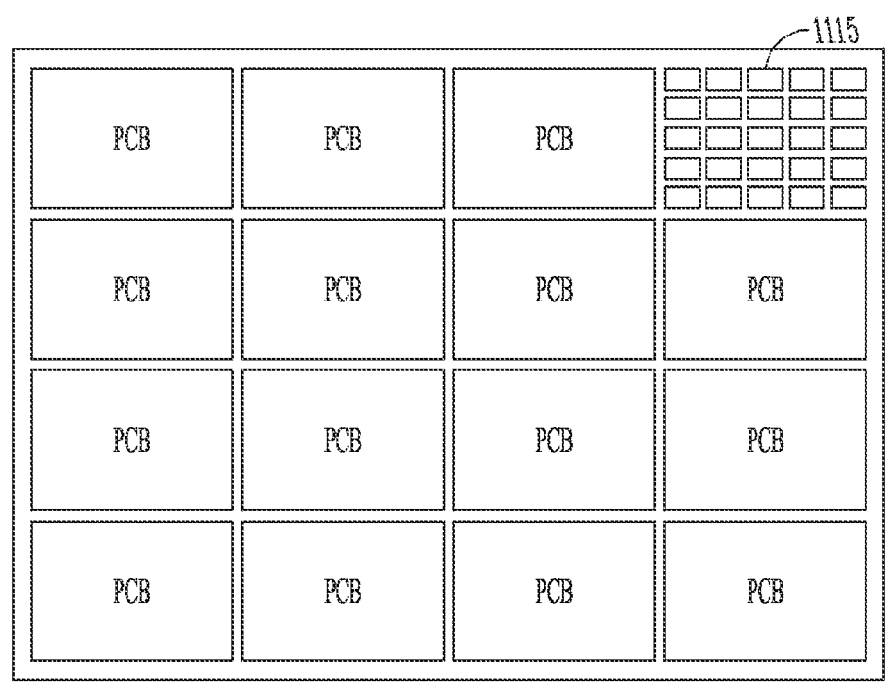
FIG. 11 is a top view representation of a circuit board panel used to form multiple circuit boards and antenna boards in place of one circuit board according to an example embodiment.

FIG. 11 is a top view representation of a circuit board panel used to form multiple circuit boards and antenna boards 1115 in place of one circuit board according to an example embodiment. The replaced circuit board is shown in a corner, but may be located in place of any other or multiple circuit boards in further embodiments.

Figure 12:
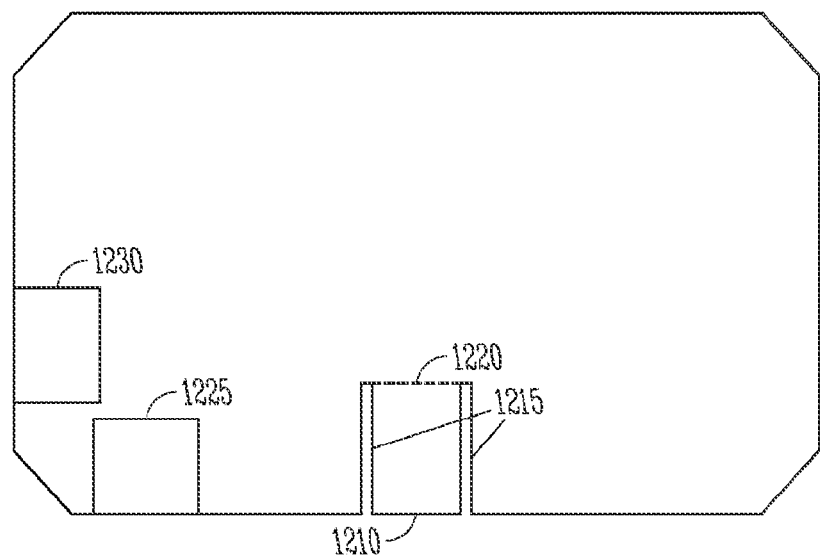
FIG. 12 is a top view representation of a circuit board formed with a detachable antenna board according to an example embodiment.

FIG. 12 is a top view representation of a circuit board formed with a detachable antenna board 1210 according to an example embodiment. The detachable antenna board 1210 may be formed within the rectangular perimeter of the circuit board, and may have edges routed or scored as indicated at 1215 to allow snapping off of the antenna board away from the circuit board. The edge snapped off at 1220 may be at least partially routed or scored to allow easier separation if desired. In this embodiment, two other antennas 1225 and 1230 are shown formed on the circuit board in orthogonal positions within the plane of the circuit board. Antennas 1225 and 1230 are coupled via traces to circuitry on the circuit board, such as RF circuitry.

Figure 13:
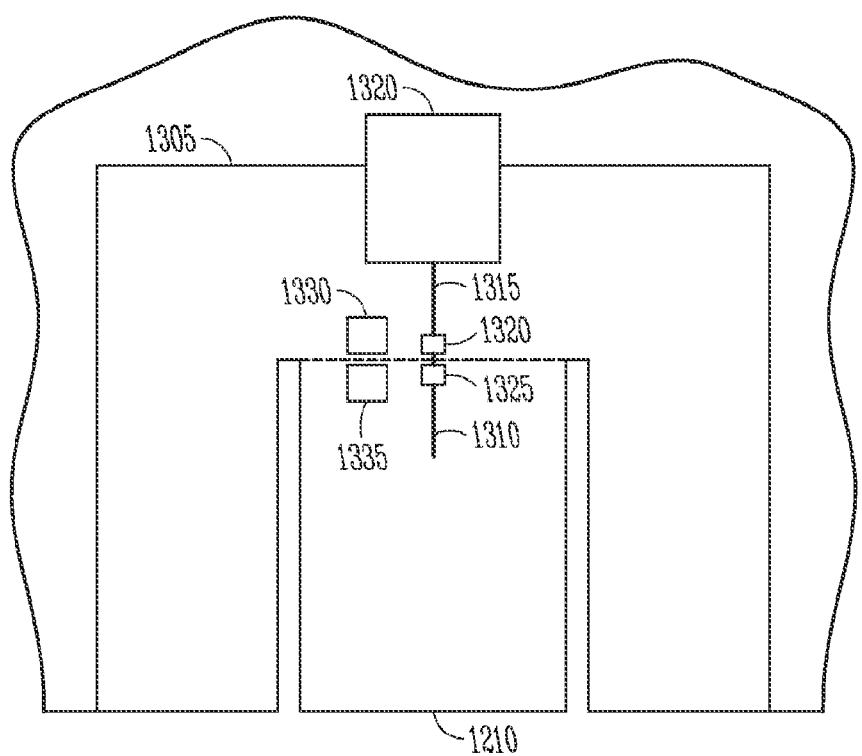
FIG. 13 is a partial top view representation of a circuit board formed with a detachable antenna board according to an example embodiment.

FIG. 13 is a partial top view representation of a circuit board 1305 formed with a detachable antenna board 1210 according to an example embodiment. This view shows further detail of the electrical connections. While the detachable antenna board 1210 is still attached to the circuit board 1305, a trace 1310 on the antenna board 1210 is coupled to a trace 1315 on the circuit board coupling it to RF circuitry 1320 on the circuit board 1305. The trace 1310 on the antenna board 1210 is coupled to the antenna trace 1315. The antenna board 1210 also includes a ground pad 1335 close to the antenna board trace 1310 for coupling to a shield of an RF cable when the antenna board 1210 is detached. A trace connects 1320 to 1325 that makes the antenna fully functional if not detached from the main circuit board. This trace is broken if that antenna board is separated from the main board. A corresponding ground pad 1330 is also formed on the circuit board 1305 close to the circuit board trace 1310, and is also to couple to the shield of the RF cable (shown at 1410 in FIG. 14). Pads 1320 and 1325 respectively are also included on both traces for coupling to the core of the RF cable. The cable may be coupled by use of solder or other material compatible with a good electrical connection.

Figure 14:
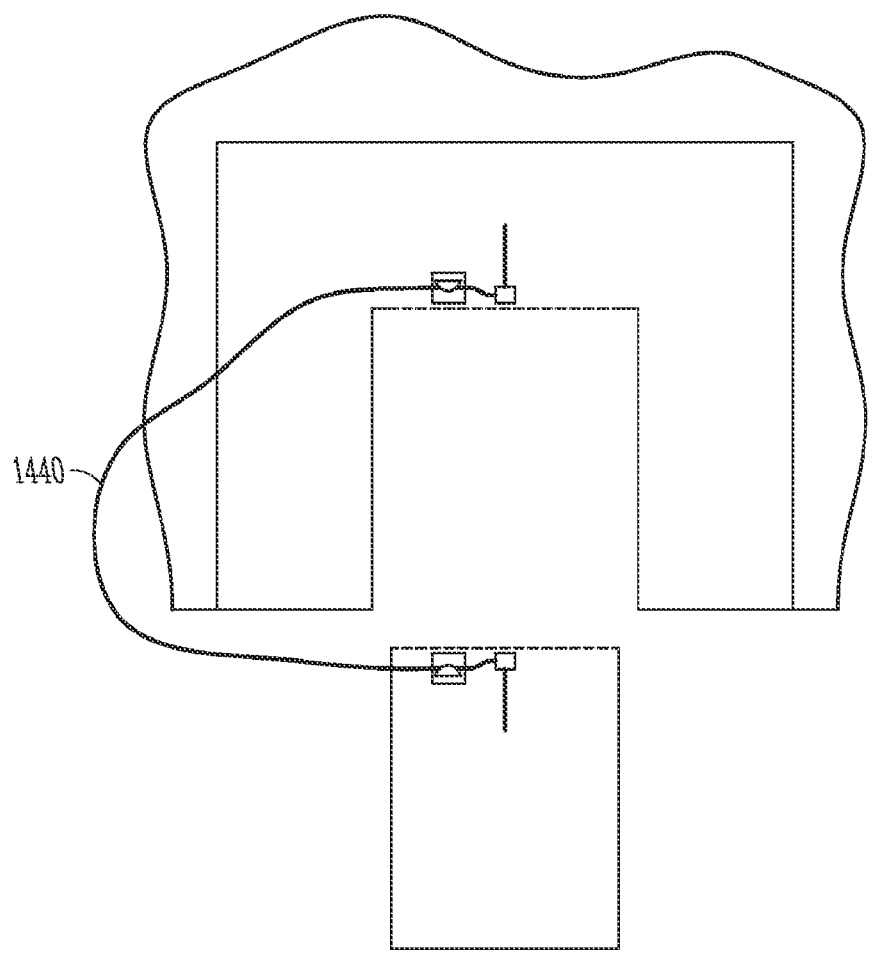
FIG. 14 is a partial top view representation of a circuit board formed with a detachable antenna board showing the antenna detached and coupled to the circuit board according to an example embodiment.

FIG. 14 is a partial top view representation of a circuit board formed with a detachable antenna board showing the antenna board detached and coupled to the circuit board according to an example embodiment. An RF cable 1440 is shown coupling the detached antenna board to the circuit board in the manner described with respect to FIG. 13. The antenna board may be mounted internally on a case of an electronic device in a vertical orientation from the circuit board in some embodiments. A plastic slot may be provided for such mounting, allowing the antenna board to be inserted and retained in position via a friction fit, clicked into place or other method. Dual sided tape may also be used in some embodiments.

A vertical orientation may provide further antenna spatial diversity, increasing performance by as much as 20 percent in some embodiments. Such spatial diversity helps combat variations in the RF medium. The antenna board may also be mounted in other orientations in further embodiments, or multiple such detachable antennas may be formed and either left attached, or otherwise detached and mounted in desired positions. In some embodiments, each RF transceiver on a circuit board may have multiple antennas mounted in various orientations for enhanced performance. Seven or more antennas may be used for some transceivers in some embodiments to enhance diversity. There may be one or more RF transceivers on the circuit board, some of which may include multiple input, multiple output transceivers.

Figure 15:
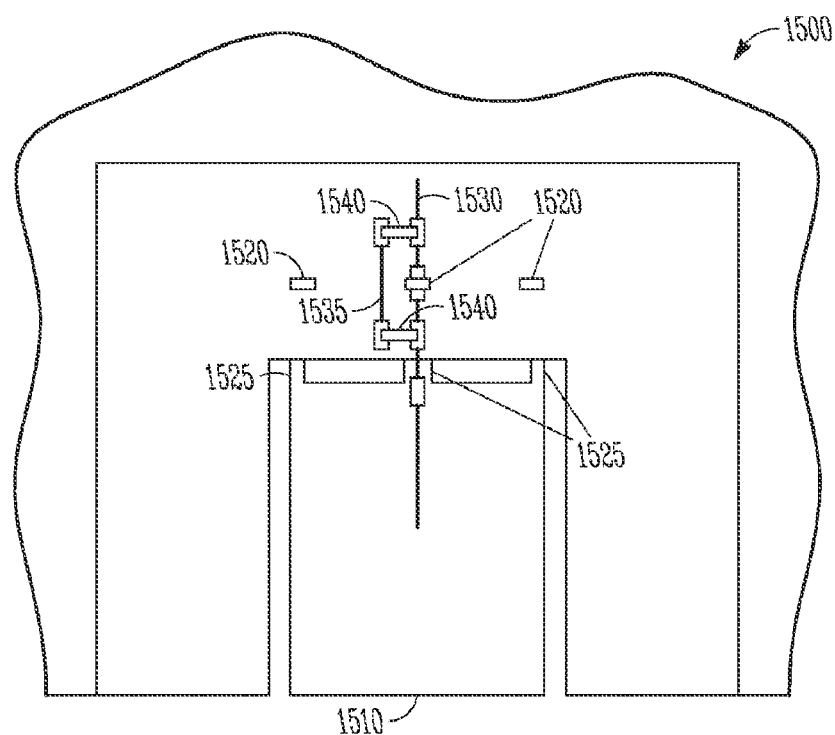
FIG. 15 is a partial top view representation of a circuit board formed with a detachable antenna board and openings for vertically connecting the antenna board according to an example embodiment.

FIG. 15 is a partial top view representation of a circuit board 1500 formed with a detachable antenna board 1510 and openings 1520 for vertically connecting the antenna board according to an example embodiment. The antenna board is formed with prongs 1525 positioned to mate with the openings 1520 when the board is detached. When the prongs on the antenna board are inserted into the openings, the antenna board is vertically oriented and supported by the circuit board. A trace 1530 on the circuit board is interrupted by one of the openings 1520 and bypassed in one embodiment by a parallel trace 1535 around the opening coupled back to the circuit board trace by zero ohm resistance devices 1540 in one embodiment. The openings and prongs or pegs maybe formed with varying distances between them to provide a keyed relationship such that they only mate in one orientation.

Figure 16:
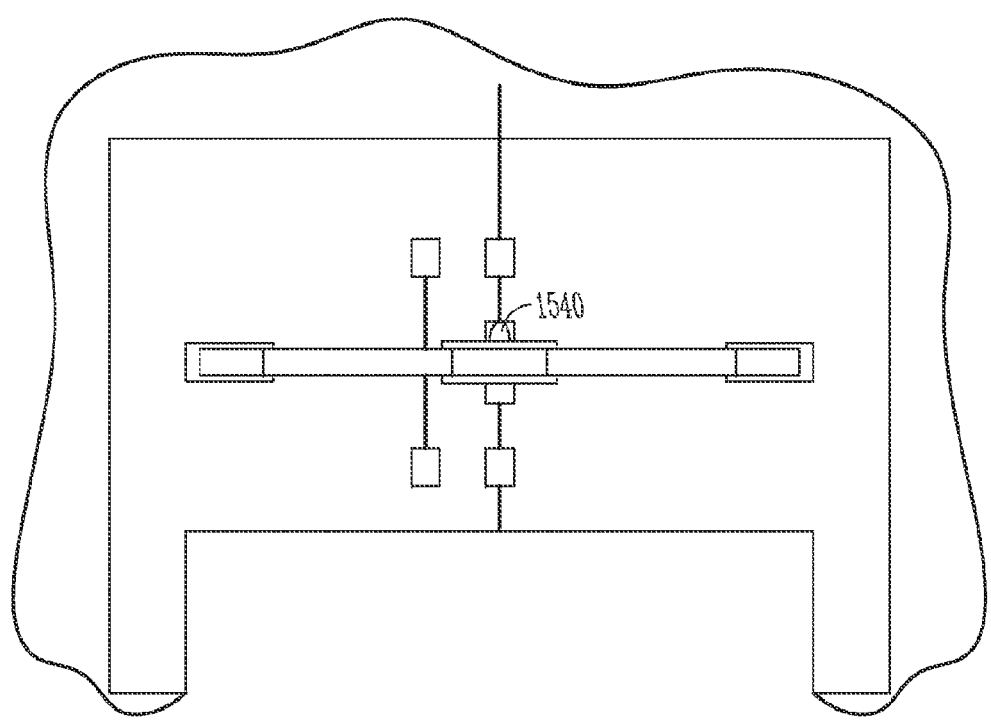
FIG. 16 is a partial top view representation of a circuit board formed with a detachable antenna board coupled vertically according to an example embodiment.

FIG. 16 is a partial top view representation of the circuit board formed with a detachable antenna board when the antenna board is detached and coupled vertically according to an example embodiment. Proper electrical connection of the corresponding traces may be made with solder 1610 in one embodiment.

Figure 17:
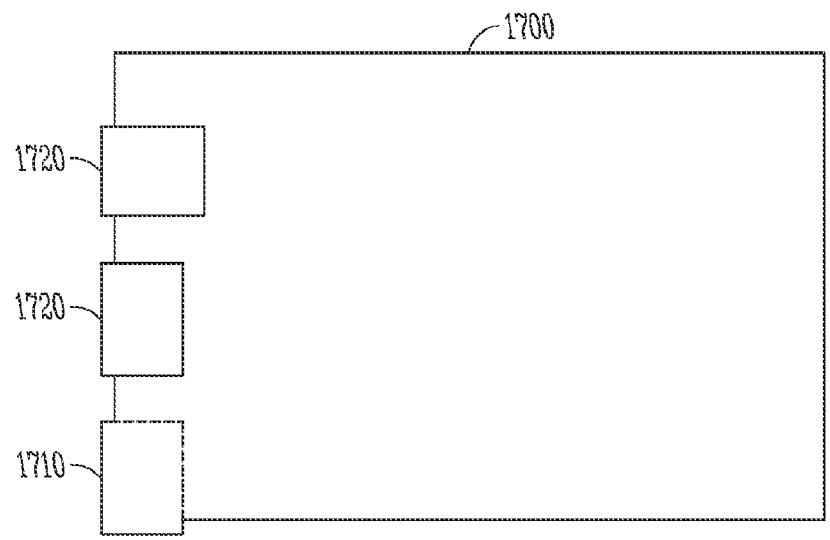
FIG. 17 is a partial top view representation of a circuit board formed with a detachable antenna board and non-detachable antennas according to an example embodiment.

FIG. 17 is a partial top view representation of a circuit board 1700 formed with a detachable antenna board 1710 and non-detachable antennas 1720 according to an example embodiment. In this embodiment, the detachable antenna board 1710 is shown formed in a corner of the circuit board 1700. There may be multiple such detachable antenna boards located in various positions that may remain electrically coupled or be detached and coupled as desired. There may also be multiple antennas formed directly on the circuit board in various orientations.

Figure 18:
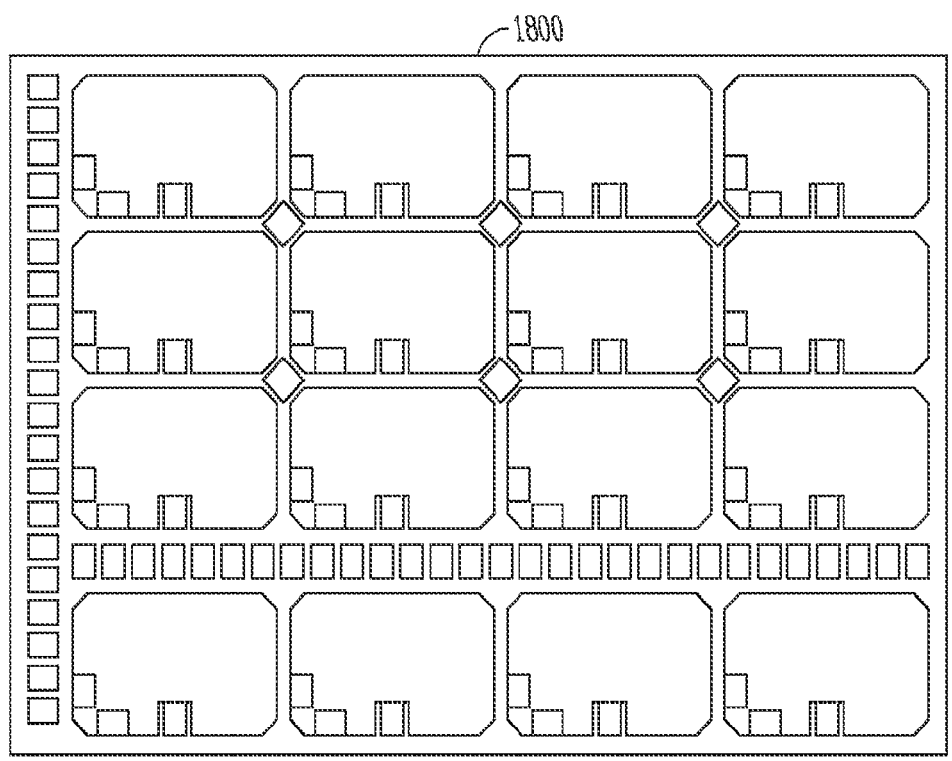
FIG. 18 is a partial top view representation of a circuit board panel formed with multiple circuit boards and antenna boards in various orientations and various configurations of detachable or non detachable antennas according to an example embodiment.

FIG. 18 is a partial top view representation of a circuit board panel 1800 formed with multiple circuit boards and antenna boards in various orientations and configurations according to an example embodiment. Panel 1800 has at least one row and one column of antenna boards, antennas formed on the circuit boards, and circuit boards with detachable antenna boards. Still further, some of the antenna boards are formed between four corners of some of the adjacent sets of circuit boards. These various arrangements of different types of antenna boards allow optimization of utilization of space on the panel, and may help to reduce overall manufacturing cost of RF components of devices, such as cell phones, routers and other wireless devices communicating via RF signals.

Figure 19:
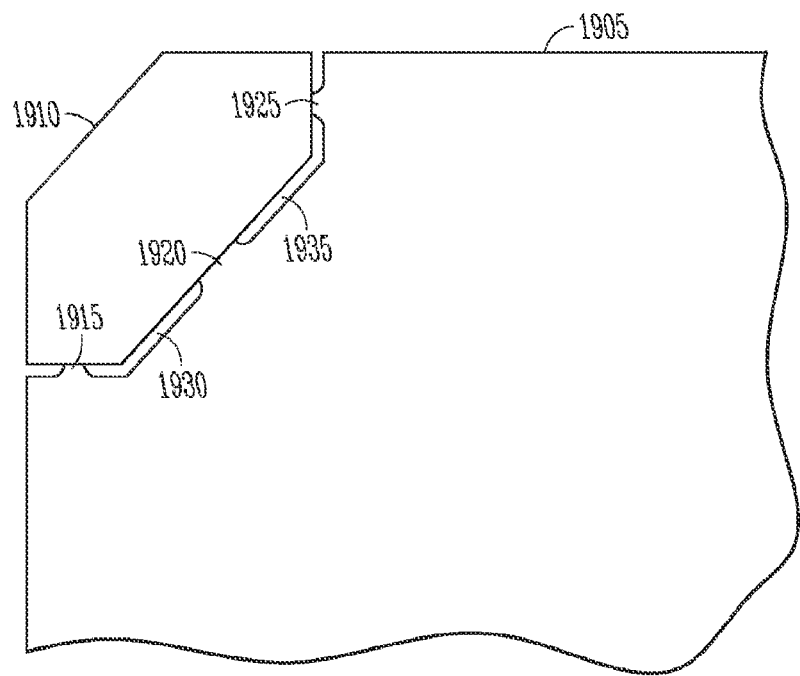
FIG. 19 is a partial top view of a circuit board having a further alternative detachable antenna board according to an example embodiment.

FIG. 19 is a partial top view of a circuit board 1905 having a further alternative detachable antenna board 1910 according to an example embodiment. Antenna board 1910 is coupled to a corner of the circuit board 1905 on three sides by prongs 1915, 1920 and 1925. Multiple portions around the antenna board 1910 are routed as indicated at 1930 and 1935 as well as from the edges of the boards to leave the prongs as adequate mechanical support. One or more antennas are printed on the antenna board 1910 and are coupled via a connective trace over one or more of the prongs. Prong 1920 is shown as wider than the other prongs to provide adequate space for the connective trace. In one embodiment, the prongs are wide enough to provide structural integrity if the antenna board 1910 is left in place, but narrow enough to allow detaching of the antenna board 1910 without adversely affecting the structural integrity of both the circuit board 1905 and antenna board 1910.

Figure 20:
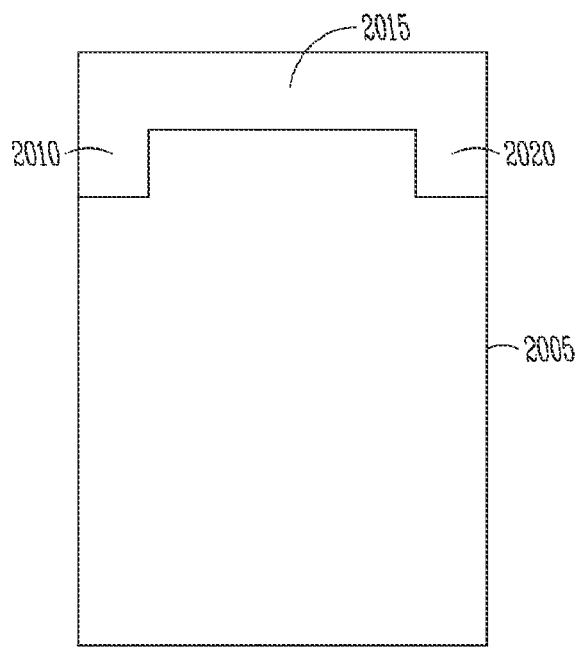
FIG. 20 is a partial top view of a circuit board having antennas formed thereon according to an example embodiment.

FIG. 20 is partial top view of a circuit board 2005 having antennas 2010, 2015, and 2020 formed thereon according to an example embodiment. In one embodiment, the antennas 2010, 2015, and 2020 are formed contiguously on one end of the circuit board 2005. One or more of the antenna boards 2010, 2015, and 2020 may be formed in a detachable manner as illustrated in FIG. 19.

Figure 21:
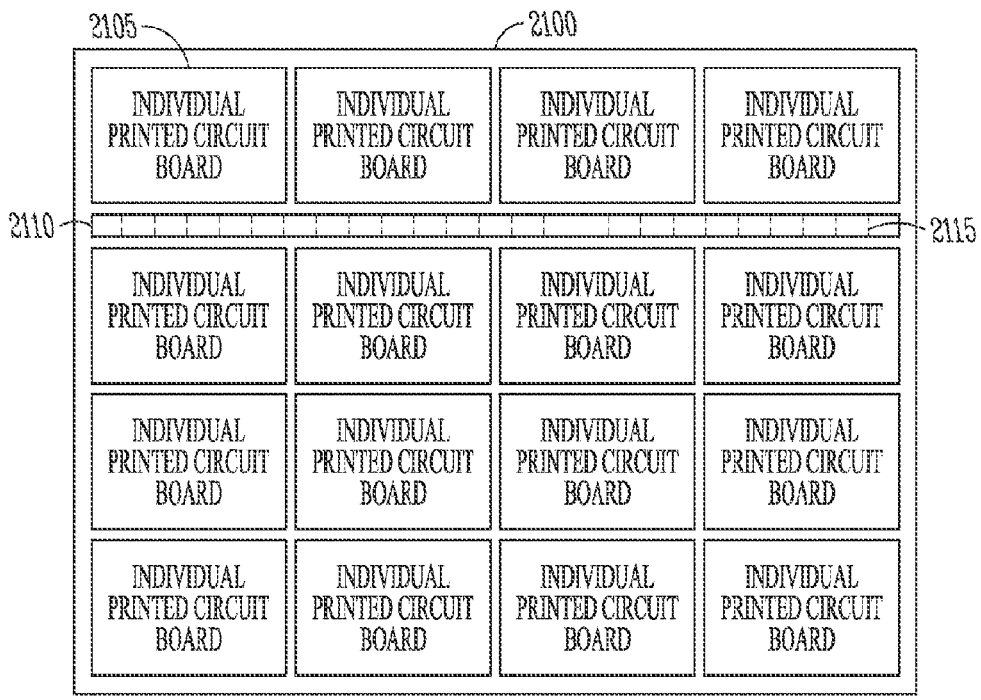
FIG. 21 is a top view of a panel having circuit boards and adjacent printed antenna boards disposed between rows of circuit boards according to an example embodiment.

FIG. 21 is a top view of a panel 2100 having circuit boards 2105 and adjacent printed antenna boards 2110 disposed between rows or columns of circuit boards according to an example embodiment. A collection of antenna boards 2110 (a row or block) is inserted in free board space. The antenna boards 2110 are appended to each other and stamped or scored at separation lines 2115 formed between the adjacent antenna boards. With this method more antennas can be put in the board panel as opposed to antenna boards laid with spaces between the boards to permit routing between the boards to later separate them. The block can be cut as one to separate it from the board panel and later on snapped out line by line (or column by column) to separate each antenna printed board. Several variations in stamping may be used. In some embodiments, the block is stamped before, during or after cutting. Stamping can be stamping, punching, drilling in line, scoring, or other method of separating adjacent boards without consuming much if any board material. Typically the block 2110 is cut out from the panel 2100, put in a tool to stamp it, and then each antenna board is manually snapped out by operators.

Figure 22:
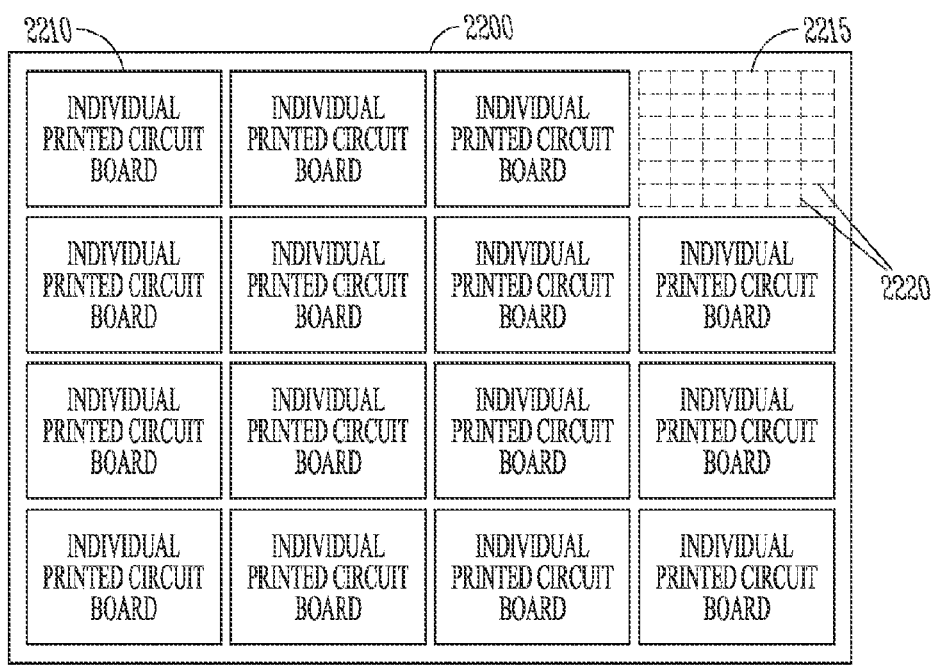
FIG. 22 is a top view representation of a circuit board panel used to form multiple circuit boards and a matrix of adjacent antenna boards in place of one circuit board according to an example embodiment.

FIG. 22 is a top view representation of a circuit board panel 2200 used to form multiple circuit boards 2210 and a matrix 2215 of adjacent antenna boards in place of one circuit board according to an example embodiment. One or more individual printed circuit boards may be replaced by a collection of antenna boards collocated to each other and stamped. The collection of antenna boards may be in the form of an array or matrix of adjacent antenna boards, referred to as a block 2215. More antennas can be put in the board panel with this method. The block 2215 can be cut as one to separate it from the board panel 2200 and later on snapped out line by line (or column by column) along horizontal and vertical stamp lines 2220 and finally snapped out one by one to separate each antenna printed board. The stamping process may be the same as that previously described, with stamping or rows and columns and operator separation by row or column followed by individual boards being snapped apart.

The Abstract is provided to comply with 37 C.F.R. §1.72(b) is submitted with the understanding that it will not be used to interpret or limit the scope or meaning of the claims.

Various Examples

Example 1 can include a method, such as including laying out traces for multiple circuit boards on a circuit board panel, identifying spare areas on the panel, laying out traces for antenna boards in the spare areas of the panel, and forming the circuit boards and antenna boards on the panel.

Example 2 can include the subject matter of Example 1, such as wherein the antenna boards are formed in a column or row on the panel.

Example 3 can include the subject matter of one or more of Examples 1-2, such as wherein the column or row is located between circuit boards.

Example 4 can include the subject matter of one or more of Examples 1-3, such as wherein the column or row is located on an outer edge of the panel.

Example 5 can include the subject matter of one or more of Examples 1-4, such as wherein antenna boards are formed in at least one column and at least one row on the panel.

Example 6 can include the subject matter of one or more of Examples 1-5, such as wherein antenna boards are formed between four adjacent corners of circuit boards.

Example 7 can include the subject matter of one or more of Examples 1-6, such as wherein the antenna boards are oriented at an angle from the circuit boards.

Example 8 can include the subject matter of one or more of Examples 1-7, such as wherein the antenna boards are formed within a rectangular perimeter of the circuit board having an unused portion of the space bounded by the rectangular perimeter.

Example 9 can include the subject matter of one or more of Examples 1-8, such as wherein at least one antenna board is formed such that it is detachable.

Example 10 can include the subject matter of one or more of Examples 1-9, such as wherein the antenna board is partially routed or scored to provide detachability.

Example 11 can include the subject matter of one or more of Examples 1-10, such as wherein the detachable antenna board is electrically coupled to circuitry on the circuit board until detached.

Example 12 can include the subject matter of one or more of Examples 1-11, such as wherein the detachable antenna board is formed with pads to facilitate electrical connections to the circuit board after the detachable antenna board is detached.

Example 13 can include the subject matter of one or more of Examples 1-12, such as wherein the antenna boards are formed in place of a circuit board in a rectangular matrix of circuit boards.

Example 14 can include the subject matter of one or more of Examples 1-13, such as further comprising routing the circuit boards and antenna boards.

Example 15 can include the subject matter of one or more of Examples 1-14, such as further comprising separating the circuit boards and antenna boards from the panel; and coupling at least one separated antenna board to a separated circuit board.

Example 16 can include the subject matter of one or more of Examples 1-15, such as wherein at least one separated antenna board is coupled to the separated circuit board in a vertical orientation.

Example 17 can include the subject matter of one or more of Examples 1-16, such as wherein the vertically oriented separated antenna board is physically coupled to the separated circuit board and soldered to connect the antenna to circuitry on the separated circuit board.

Example 18 can include the subject matter of one or more of Examples 1-17, such as wherein an antenna included in the plurality of antenna boards is formed to behave like a Meta material (MTM) antenna.

Example 19 can include a method, such as including the subject matter of one or more of Examples 1-18, the method including laying out traces for a circuit board on a circuit board panel, laying out traces for an antenna board such that it is electrically coupled to traces on the circuit board, forming the circuit boards and antenna board on the panel, and at least partially routing around the antenna board such that it is detachable from the circuit board.

Example 20 can include the subject matter of Example 19, such as further comprising routing pegs on the antenna board, and routing slots on the circuit board to mate with the pegs on the antenna board.

Example 21 can include the subject matter of one or more of Examples 19-20, such as further comprising detaching the antenna board from the circuit board, and inserting the pegs in the slots such that the antenna is mounted in a vertical orientation to the circuit board.

Example 22 can include the subject matter of one or more of Examples 19-21, such as further comprising soldering the antenna board to the circuit board to reestablish electrical contact.

Example 23 can include an apparatus, such as using one or more techniques or portions of the subject matter included in one or more of Examples 1-22, the apparatus including a circuit board panel comprising a plurality of circuit boards, and a plurality of antenna boards formed in spare areas about the plurality of circuit boards.

Example 24 can include the subject matter of Example 23, such as wherein the circuit boards are laid out in an array of rows and columns, and wherein the antenna boards are formed in rows or columns about the rows and columns of the circuit boards.

Example 25 can include the subject matter of one or more of Examples 23-24, such as wherein the rows or columns of antenna boards are formed between corresponding rows or columns of circuit boards.

Example 26 can include the subject matter of one or more of Examples 23-25, such as wherein the circuit boards are laid out in an array of rows and columns, and wherein the antenna boards are formed between four adjacent corners of the circuit boards.

Example 27 can include an apparatus such as using one or more techniques or portions of the subject matter included in one or more of Examples 1-26, the apparatus including a circuit board panel comprising a plurality of circuit boards, and a plurality of antenna boards, at least one of which is electrically coupled to a circuit board and is at least partially routed such that it is detachable from the circuit board.

Example 28 can include the subject matter of Example 27, such as wherein the antenna board and circuit board include pads to facilitate electrical coupling when the antenna board is detached.

Example 29 can include the subject matter of one or more of Examples 27-28, such as wherein the antenna board includes tabs, and wherein the circuit board includes corresponding slots.

Example 30 can include the subject matter of one or more of Examples 27-29, such as wherein the tabs and slots are arranged such that when the antenna board is detached and inserted in the circuit board, the antenna is vertically oriented with respect to the circuit board.

Example 31 can include the subject matter of one or more of Examples 27-30, such as wherein the tabs and slots are keyed such that the antenna board can only be inserted in one direction and such that contacts line to facilitate proper electrical connection.

Example 32 can include the subject matter of one or more of Examples 27-31, such as wherein an antenna included in the plurality of antenna boards is formed to behave like a Meta material (MTM) antenna.

The invention claimed is:

1. A method comprising:
   laying out traces for multiple circuit boards on a circuit board panel;
   identifying spare areas on the panel;
   laying out traces for antenna boards in the spare areas of the panel; and
   forming the circuit boards and antenna boards on the panel;
   wherein at least one antenna board amongst the antenna boards is formed such that it is detachable; and
   wherein the at least one detachable antenna board is electrically coupled to circuitry on a circuit board amongst the multiple circuit boards, until the at least one detachable antenna board is detached.

2. The method of claim 1, wherein the antenna boards are formed in a column or row on the panel.

3. The method of claim 2, wherein the column or row is located between circuit boards.

4. The method of claim 2, wherein the column or row is located on an outer edge of the panel.

5. The method of claim 1, wherein antenna boards are formed in at least one column and at least one row on the panel.

6. The method of claim 1, wherein antenna boards are formed between four adjacent corners of circuit boards.

7. The method of claim 6, wherein the antenna boards are oriented at an angle from the circuit boards.

8. The method of claim 1, wherein the antenna boards are formed within a rectangular perimeter of the circuit board having an unused portion of the space bounded by the rectangular perimeter.

9. The method of claim 1, wherein the antenna board is partially routed or scored to provide detachability.

10. The method of claim 1, wherein the detachable antenna board is formed with pads to facilitate electrical connections to the circuit board after the detachable antenna board is detached.

11. The method of claim 1, wherein the antenna boards are formed in place of a circuit board in a rectangular matrix of circuit boards.

12. The method of claim 1, and further comprising routing the circuit boards and antenna boards.

13. The method of claim 12, and further comprising:
    separating the circuit boards and antenna boards from the panel; and
    coupling at least one separated antenna board to a separated circuit board.

14. The method of claim 13, wherein at least one separated antenna board is coupled to the separated circuit board in a vertical orientation.

15. The method of claim 14, wherein the vertically oriented separated antenna board is physically coupled to the separated circuit board and soldered to connect the antenna to circuitry on the separated circuit board.

16. The method of claim 1, wherein an antenna included in the plurality of antenna boards is formed to behave like a Meta material (MTM) antenna.

17. A circuit board panel comprising:
a plurality of circuit boards; and
a plurality of antenna boards formed in spare areas nearby the plurality of circuit boards;
wherein at least one antenna board amongst the antenna boards is detachable and is electrically coupled to circuitry on a circuit board amongst the multiple circuit boards, until the at least one detachable antenna board is detached.

18. The circuit board panel of claim 17, wherein an antenna included in the plurality of antenna boards is formed to behave like a Meta material (MTM) antenna.

19. The circuit board panel of claim 17, wherein the detachable antenna board includes pads to facilitate electrical connections to the circuit board after the detachable antenna board is detached.

* * * * *